United States Patent
Tsao et al.

(10) Patent No.: US 12,104,611 B2
(45) Date of Patent: Oct. 1, 2024

(54) FAN SYSTEM AND FAN DRIVING METHOD

(71) Applicant: Sentelic Corporation, Taipei (TW)

(72) Inventors: Yu-Chung Tsao, Taipei (TW); Chin-Chang Lee, Taipei (TW)

(73) Assignee: Sentelic Corporation, Taipei (TW)

( * ) Notice: Subject to any disclaimer, the term of this patent is extended or adjusted under 35 U.S.C. 154(b) by 841 days.

(21) Appl. No.: 17/214,938

(22) Filed: Mar. 29, 2021

(65) Prior Publication Data

US 2022/0252078 A1 Aug. 11, 2022

(30) Foreign Application Priority Data

Feb. 5, 2021 (TW) .................................. 110104415

(51) Int. Cl.
*F04D 27/00* (2006.01)
*F04D 25/16* (2006.01)
*G05B 15/02* (2006.01)
*H03K 7/08* (2006.01)

(52) U.S. Cl.
CPC .......... *F04D 27/004* (2013.01); *F04D 25/16* (2013.01); *G05B 15/02* (2013.01); *H03K 7/08* (2013.01)

(58) Field of Classification Search
CPC ...... F04D 27/004; F04D 25/16; F04D 25/166; G05B 15/02; G05B 2219/2614; H03K 7/08; Y02B 30/70
USPC ........................................................ 700/28
See application file for complete search history.

(56) References Cited

U.S. PATENT DOCUMENTS

| 6,257,832 B1 | 7/2001 | Lyszkowski et al. |
| 2004/0027105 A1 | 2/2004 | Nakamura et al. |
| 2018/0373300 A1* | 12/2018 | Bhatia ..................... G06F 1/206 |

FOREIGN PATENT DOCUMENTS

| CN | 1574594 A | 2/2005 |
| CN | 1282298 C | 10/2006 |
| CN | 101408186 B | 8/2011 |
| CN | 102748312 A | 10/2012 |
| TW | I365595 B | 6/2012 |
| TW | 201243162 A | 11/2012 |
| TW | 201437489 A | 10/2014 |
| TW | I563178 B | 12/2016 |

* cited by examiner

*Primary Examiner* — Mohammad Ali
*Assistant Examiner* — Saad M Kabir
(74) *Attorney, Agent, or Firm* — CKC & Partners Co., LLC

(57) ABSTRACT

The present disclosure relates to a fan system and a fan driving method. The fan system includes a first fan and a second fan, which are used to operate according to a first driving signal and a second driving signal, respectively, and to generate a first rotating speed signal and a second rotating speed signal. The first rotating signal has a first phase, and the second rotating signal has a second phase. The second fan is electrically connected to the first fan to receive the first rotating speed signal, and obtain a detected phase difference between the first phase and the second phase. The second fan is further configured to selectively increase or decrease the duty cycle of the second driving signal according to the detected phase difference, so that the second phase is adjusted to maintain a preset phase difference with the first phase.

13 Claims, 6 Drawing Sheets

FAN SYSTEM AND FAN DRIVING METHOD

CROSS-REFERENCE TO RELATED APPLICATION

This application claims priority to Taiwan Application Serial Number 110104415, filed Feb. 5, 2021, which is herein incorporated by reference in its entirety.

BACKGROUND

Technical Field

The present disclosure relates to a fan system and a fan driving method, especially for controlling multiple fans to maintain the same rotating speed.

Description of Related Art

With the development of technology, the operating frequency of various electronic devices has increased, but the increase in operating frequency increases the internal temperature of the electronic device during operation. In order to prevent high temperature from affecting the operation of electronic devices and even damage to electronic devices, "fans" have become an indispensable accessory for electronic devices to maintain operation.

Generally speaking, the fan system includes multiple fans, and the fans are controlled at the same rotating speed. However, during actual operation of the fans, rotating speed often fluctuates due to various variables or different operating requirements, and the rotating speed may also be adjusted according to power supply requirements.

SUMMARY

One aspect of the present disclosure is a fan driving method, comprising the following steps: driving a first fan according to a first drivingsignal, and driving a second fan according to a second driving signal; obtaining a first rotating speed signal from the first fan, and obtaining a second rotating speed signal from the second fan, wherein the first rotating speed signal has a first phase, and the second rotating speed signal has a second phase; comparing a difference between the second phase and the first phase to obtain a detection phase difference when determining that the first phase is unstable; and selectively increasing or decreasing a duty cycle of the second driving signal according to the detection phase difference to adjust the second phase to maintain a preset phase difference with the first phase.

Another aspect of the present disclosure is a fan system, comprising a first fan and a second fan. The first fan is configured to operate according to a first driving signal to generate a first rotating speed signal. The first rotating speed signal has a first phase. The second fan is electrically coupled to the first fan, and configured to operate according to a second driving signal to generate a second rotating speed signal. The second rotating speed signal has a second phase, the second fan is configured to receive the first rotating speed signal, so as to obtain a detection phase difference between the first phase and the second phase. The second fan is further configured to selectively increase or decrease a duty cycle of the second driving signal according to the detection phase difference, and the second phase is adjusted to maintain a preset phase difference with the first phase.

Another aspect of the present disclosure is a fan driving method, comprising the following steps: driving a first fan according to a first drivingsignal, and driving a second fan according to a second driving signal; obtaining a first rotating speed signal from the first fan, and obtaining a second rotating speed signal from the second fan, wherein the first rotating speed signal has a first frequency, and the second rotating speed signal has a second frequency; comparing a difference between the second frequency and the first frequency to obtain a detection frequency difference when determining that the first frequency is unstable; and increasing or decreasing a duty cycle of the second driving signal selectively to change the second frequency toward the first frequency according to the detection frequency difference.

It is to be understood that both the foregoing general description and the following detailed description are by examples, and are intended to provide further explanation of the disclosure as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

For the embodiment below is described in detail with the accompanying drawings, embodiments are not provided to limit the scope of the present disclosure. Moreover, the operation of the described structure is not for limiting the order of implementation. Any device with equivalent functions that is produced from a structure formed by a recombination of elements is all covered by the scope of the present disclosure. Drawings are for the purpose of illustration only, and not plotted in accordance with the original size.

It will be understood that when an element is referred to as being "connected to" or "coupled to", it can be directly connected or coupled to the other element or intervening elements may be present. In contrast, when an element to another element is referred to as being "directly connected" or "directly coupled," there are no intervening elements present. As used herein, the term "and/or" includes an associated listed items or any and all combinations of more.

Figure 1A:
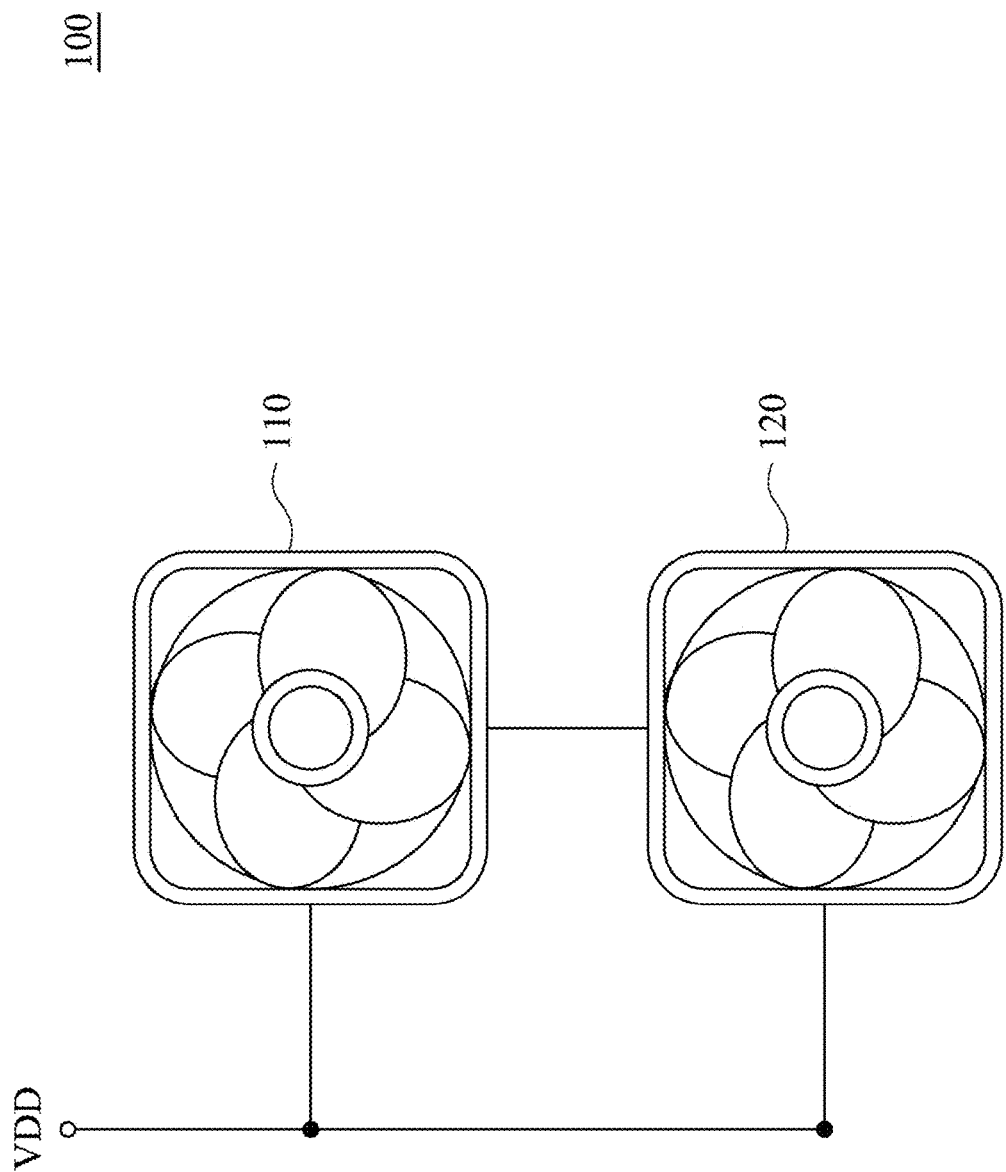
FIG. 1A is a schematic diagram of a fan system in some embodiments of the present disclosure.
Figure 1B:
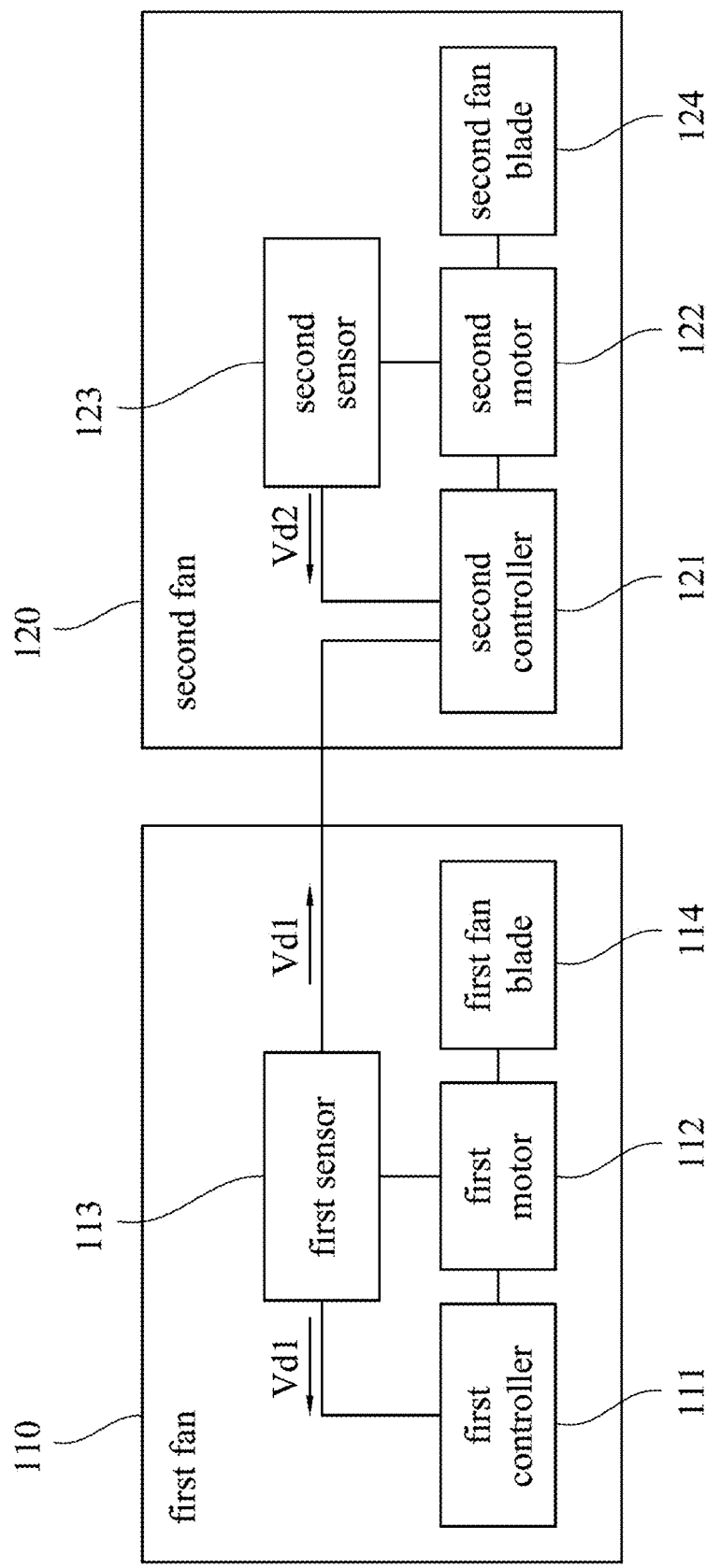
FIG. 1B is a schematic diagram of a fan system in some embodiments of the present disclosure.

FIGS. 1A and 1B are schematic diagrams of a fan system 100 in some embodiments of the present disclosure. The fan system 100 at least includes a first fan 110 and a second fan 120. The first fan 110 is configured to operate according to the first driving signal, so as to generate a first rotating speed signal. The second fan 120 operates according to the second driving signal, so as to generate a second rotating speed signal.

As shown in FIG. 1A and FIG. 1B, the first fan 110 includes a first controller 111, a first motor 112, a first sensor 113 and a first fan blade 114. The second fan 120 includes a second controller 121, a second motor 122, a second sensor 123 and a second fan blade 124. The first fan 110 and the second fan 120 all operates according to the power supply VDD, and the controllers 111/121 adjust the power provided to the motors 112/122 according to the driving signal, so as to drive the fan blades 114/124 rotating. The driving signal may be generated by the controller 111/121, or may be received from the outside, such as a motherboard.

In some embodiments, the first/second second driving signals are in the form of the Pulse Width Modulation (PWM), and adjusts the operating time of the motors 112/122 by changing the duty cycle of the power, and the rotating speed of the fan will be changed. For example, when the duty cycle of the first/second second driving signals are 60%, it means that the rotating speed of the fan is 60% of the maximum rotating speed.

Figure 2A:
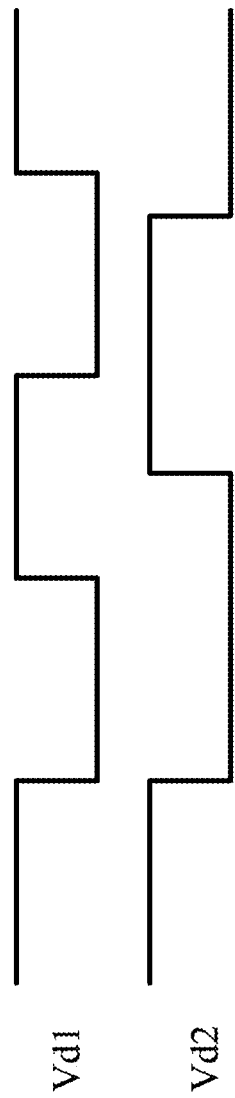
FIG. 2A is a waveform of the rotating speed signal in some embodiments of the present disclosure.

The rotating speed signals Vd1/Vd2 are configured to represent the current rotating speed of the fans 110/120. In one embodiment, the sensors 113/123 of the first fan 110 and the second fan 120 are configured to detect the fan blade 114/124 or the position of the rotor in the motors 112/122, so as to generate rotating speed signals. The waveform of the rotating speed signals is a square wave (as shown in FIG. 2A, will be detailed in subsequent paragraphs). The first rotating speed signal Vd1 has a first phase and a first frequency. The second rotating speed signal Vd2 has a second phase and a second frequency. The frequency (period time) of the rotating speed signals Vd1/Vd2 may represent the rotating speed. In some other embodiments, the fans 110/120 may not have a detector, and the current position of the fan blade or the motor rotor is calculated through current feedback signal. Since one skilled in the art can understand the way the rotating speed signal is generated, it will not be repeated here.

In the embodiment, the second fan 120 adjust the own rotating speed according to the rotating speed of the first fan 110, so that the rotating speed of the second fan 120 may be consistent with the rotating speed of the first fan 110, but the phase of the second rotating speed signal Vd2 must be staggered with the first rotating speed signal Vd1 (e.g., 90 degrees) to avoid unstable supply current.

Specifically, the second fan 120 is electrically coupled the first fan 110, so as to receive the first rotating speed signal Vd1 recorded by the first sensor 113. After the second controller 121 of the second fan 120 receives the first rotating speed signal Vd1, the second controller 121 compares a difference between the first phase of the first rotating speed signal Vd1 and the second phase of the second rotating speed signal Vd2, so as to obtain a detection phase difference.

For example, if the first phase of the first rotating speed signal Vd1 is behind the preset second phase of the second rotating speed signal Vd2 by 20 degrees, the second controller 121 of the second fan 120 increases the duty cycle of the second driving signal. At this time, the second phase of the second rotating speed signal Vd2 moves forward, so that phase difference between the second phase and the first phase will increase to match a preset phase difference (i.e., the phase difference changes from 20 degrees to 90 degrees).

On the other hand, if the first phase of the first rotating speed signal Vd1 leads the second phase of the second rotating speed signal Vd2 by 20 degrees, the second controller 121 of the second fan 120 decreases the duty cycle of the second driving signal. At this time, the second phase of the second rotating speed signal Vd2 moves back, so that phase difference between the second phase and the first phase will increase to match a preset phase difference. In other words, the second fan 120 selectively increase or decrease a duty cycle of the second driving signal according to the detection phase difference, so that the second phase may be adjusted to maintain the preset phase difference (e.g., 90 degrees) from the first phase.

In some embodiments, in addition to the first fan 110 and the second fan 120, the fan system 100 further includes multiple fans such as a third fan and a fourth fan. As in the above control method of the second fan 120, the other fans may electrically coupled to the first fan 110 to receive the first rotating speed signal, and control the rotating speed for the first fan 110 according to the first rotating speed signal and the detection phase difference, but the phase of the rotating speed signals are staggered (e.g., the phase of the first fan leads the phase of the second fan by 45 degrees, and the phase of the first fan leads the phase of the third fan by 90 degrees). Accordingly, it can avoid the unstable power supply caused by the excessive instant current due to the same phase of multiple fans.

In some embodiments, in order to maintain the same rotating speed for all fans, the fan system 100 can adjust the phase of the rotating speed signal in different ways according to different conditions. FIG. 2A is a waveform of the rotating speed signal in some embodiments of the present disclosure. In one embodiment, the first rotating speed signal Vd1 and the second rotating speed signal Vd2 has an obvious phase difference, and the frequency and period are also different. As shown in figure, the frequency of the first rotating speed signal Vd1 is obvious larger than the frequency of the second rotating speed signal Vd2. In other words, the rotating speed of the first rotating speed and the second rotating speed are very different. At this time, the second fan 120 increases the duty cycle of the second driving signal, so that the frequency of the second rotating speed signal Vd2 increases to the frequency of the first rotating speed signal Vd1 (i.e., the same rotating speed).

The some other embodiments, the second fan 120 determines whether the frequency of the first rotating speed signal Vd1 is stable. If the frequency of the first rotating speed signal Vd1 keeps changing during a period of time, it means that the rotating speed of the first fan 110 not stable yet (such as accelerating or decelerating). When the frequency of the first rotating speed signal is unstable, the second fan 120 first adjusts the duty cycle of the second driving signal through the above method, so that the rotating speed of the second fan 120 is close to the rotating speed of the first fan 110.

Overall, the second fan 120 compares a difference between the first frequency of the first rotating speed signal Vd1 and the second frequency of the second rotating speed signal to obtain a detection frequency difference (or the difference in period length). Then, through the detection frequency difference (e.g., the second frequency is lower than the first frequency), the second fan 120 selectively increases or decreases the duty cycle of the second driving signal, so that the second frequency changes toward the first frequency, and the first fan 110 and the second fan 120 have the same rotating speed.

Figure 2B:
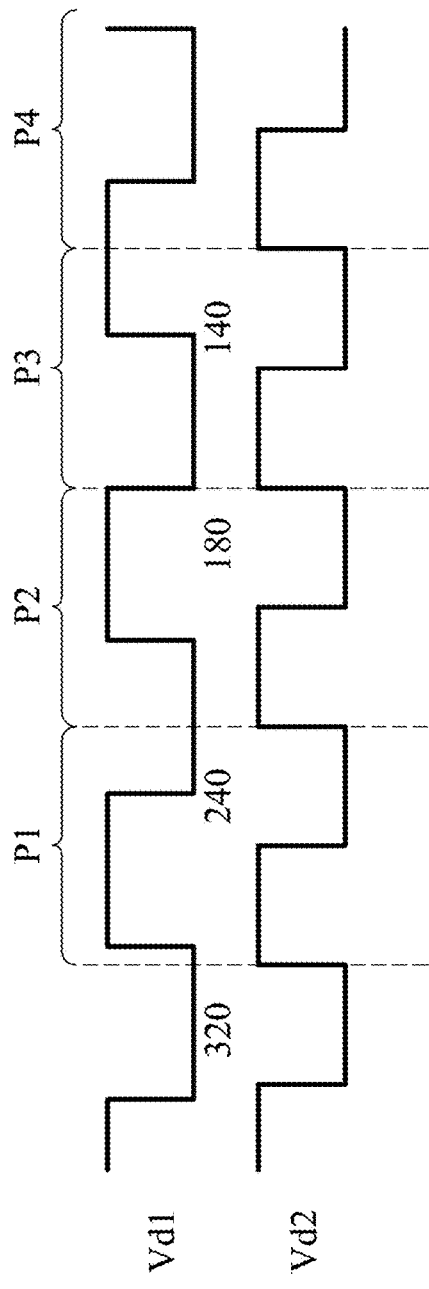
FIG. 2B is a waveform of the rotating speed signal in some embodiments of the present disclosure.

As shown in FIG. 2B, the other embodiment, when the frequency of the first rotating speed signal Vd1 becomes stable, the second fan 120 determines whether the detection phase difference and the preset phase difference are within a set range (e.g., whether it is less than 10%). If the phase difference is much larger than the preset phase difference (e.g., the phase difference is 20%, but the preset phase difference is 8%), the second fan 120 adjusts the duty cycle of the second driving signal according to the detection phase difference, so that the rotating speed of the second fan 120 is close to the rotating speed of the first fan 110.

On the other hand, if the phase difference is much less than or equal to the preset phase difference, the second fan 120 adjusts the phase of the second rotating speed signal Vd2 (the phase of the second driving signal), so that the first phase and the second phase are maintained at a preset interval of the phase difference. In some embodiments, the second fan 120 will temporarily adjust the duty cycle of the second driving signal, so that the phase of the second driving signal and the second rotating speed signal are changed (e.g., moving forward or moving backward). The first rotating speed signal and the second rotating speed signal are maintained at the phase difference.

Specifically, if the detection phase difference detected by the second fan 120 is "+20 degrees", it means that the second phase of the second rotating speed signal Vd2 leads the first phase of the first rotating speed signal Vd1 by 20 degrees. At this time, in order to adjust the second phase of the second rotating speed signal Vd2 without changing the average rotating speed of the second fan 120, the second fan 120 first adjusts the duty cycle of the second driving signal briefly, and then restores the original the duty cycle. For example, as shown in FIG. 2B, during the first period P1, the second fan 120 increases the duty cycle of the second driving signal from the first ratio (e.g., 60%) to the second ratio (e.g., 80%). After the first period P1 and entering the second period P2, the second fan 120 restores the duty cycle of the second driving signal to the original the first ratio (eg: 60%). Accordingly, the phase difference between the second rotating speed signal Vd2 and the first rotating speed signal Vd1 will be increased, but the speed of the second fan 120 will not change.

In addition, after the first period P1, the second fan 120 will determine whether the detection phase difference between the first phase and the second phase matches the preset phase difference again, or will determine whether the detection phase difference and the preset phase difference are within a set range (such as 5%, 3% or 2%). The second fan 120 may respectively detect the signal period length of the first rotating speed signal Vd1 and the second rotating speed signal Vd2 to perform the above determination.

In some other embodiments, the second controller 121 of the second fan 120 can record multiple signal phases of the first rotating speed signal Vd1 at every starting time point of each period of the second rotating speed signal Vd2, and compare the multiple signal phases recorded each time, so as to determine whether "the first rotating speed signal Vd1 is stable" or "the detection phase difference between the first rotating speed signal Vd1 and the second rotating speed signal Vd2". For example, as shown in FIG. 2B, if the second fan 120 does not adjust the second driving signal, and when every the starting time point of the four periods P1-P4 of the second rotating speed signal Vd2, the multiple signal phases of the first rotating speed signal Vd1 recorded are "320 degrees, 240 degrees, 180 degrees, 140 degrees", it means that the frequency of the first rotating speed signal Vd1 is unstable.

On the other hand, after the second driving signal is adjusted by the second fan 120, when each of the starting time points of the four periods P1-P4 of the second rotating speed signal Vd2, if the multiple signal phases of the recorded the first rotating speed signal Vd1 is "320 degrees, 240 degrees, 180 degrees, 140 degrees", it means that the second phase is gradually increasing. If the preset phase difference is "90 degrees", when one starting time point of one period of the second rotating speed signal Vd2, and the signal phase of the first rotating speed signal Vd1 is "90 degrees", it means that the signal adjustment has been completed.

Figure 2C:
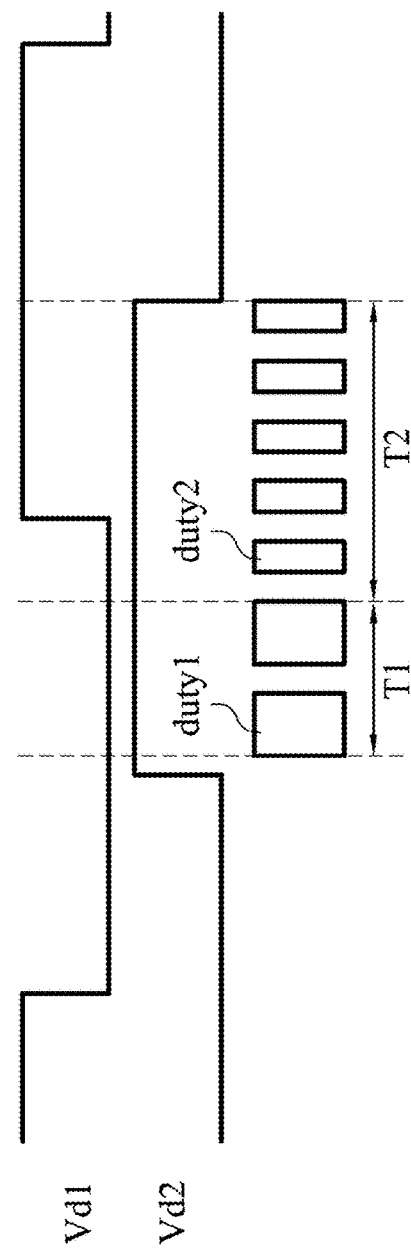
FIG. 2C is a waveform of the rotating speed signal in some embodiments of the present disclosure.

As shown in FIG. 2C, in one embodiment, if the phase difference between the first phase and the second phase (e.g., 83 degrees) is very close to the preset the phase difference (e.g., 90 degrees), the second phase of the second rotating speed signal Vd2 can be adjusted through a more subtle method. As shown in FIG. 2C, the "width" of the rectangle "duty1, duty2" represents the "Strength" of the duty cycle of the second driving signal corresponding to the second rotating speed signal Vd2. That is, in the embodiment shown in FIG. 2C, the duty cycle duty1 is greater than the duty cycle duty2, so that the second phase can move forward accordingly.

As mentioned above, specifically, when an adjustment time T1 of the first period, the second fan 120 increases the duty cycle of the second driving signal from the first ratio (i.e., duty1, such as 60%) to the second ratio (i.e., duty2, such as 80%) according to the detection phase difference. When a recovery time T2 of the first period, the second fan 120 restores the duty cycle of the second driving signal from the second ratio (i.e., duty2, such as 80%) to the first ratio (i.e., duty1, such as 60%). In other words, the second fan 120 will instantly change the duty cycle of the second driving signal in one period, and then restore the original duty cycle, so as to adjust the second phase. The length of the adjustment time T1 (i.e., the proportion of the first period) can be changed according to the detection phase difference. For example, the greater the detection phase difference, the longer the adjustment time T1.

the some other embodiments, the second fan 120 gradually changes the duty cycle. That is, the duty cycle of the second driving signal changes linearly from the first ratio (60%) to the second ratio (80%), and then restores to the first ratio.

In some embodiments, the second fan 120 determines whether the detection phase difference (i.e., the actual difference between the second phase and the first phase) and the preset phase difference (i.e., the ideal difference between the second phase and the first phase) are within a set range (e.g., 5%, 3% or 2%). If so, it means that the detection phase difference is very close to the preset phase difference, and the second fan 120 uses the method shown in FIG. 2C to adjust the second driving signal. Otherwise, the second fan 120 adjusts the second phase of the second driving signal according to the method in FIG. 2B.

Figure 3:
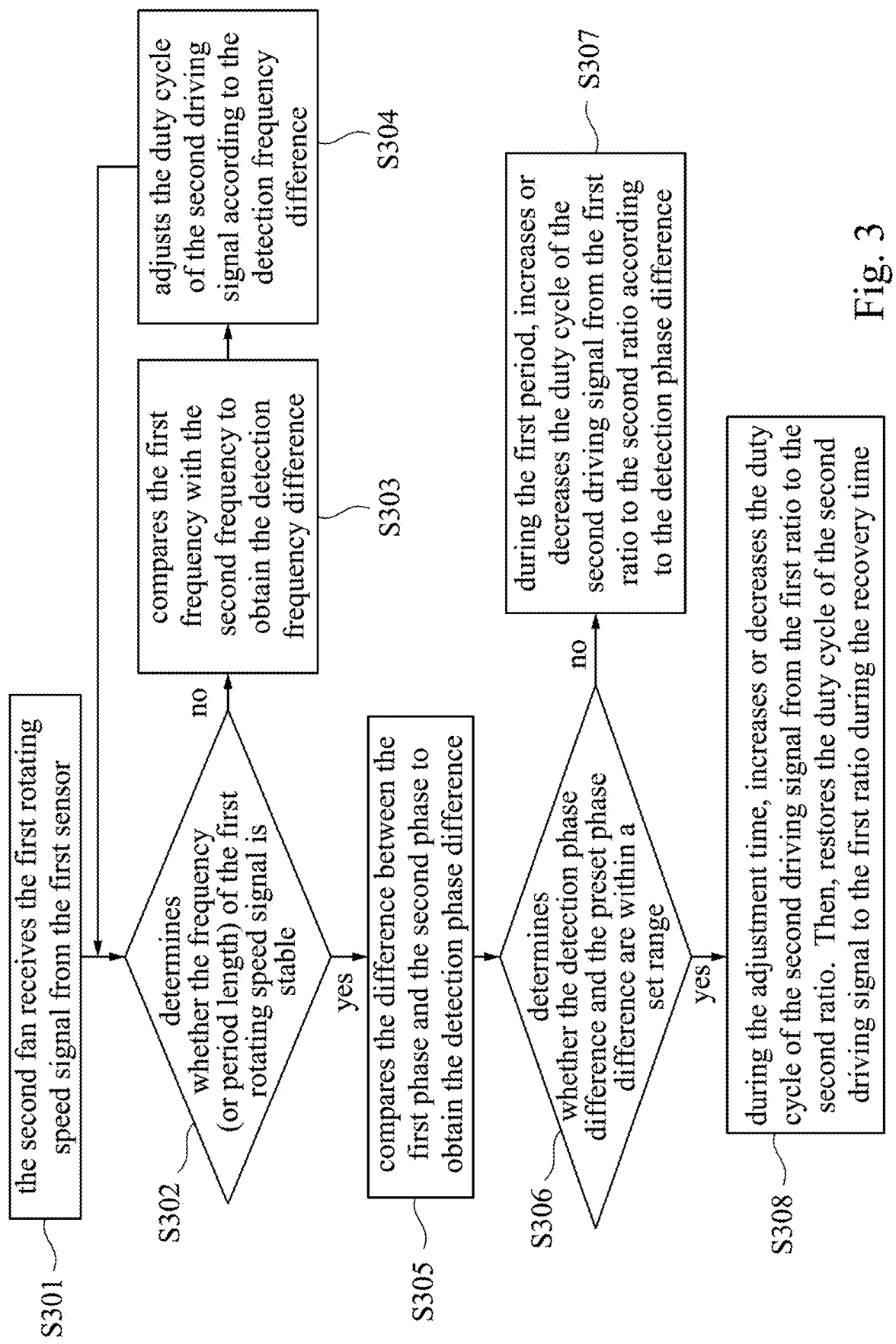
FIG. 3 is a flowchart illustrating a fan driving method in some embodiments of the present disclosure.

FIG. 3 is a flowchart illustrating a fan driving method in some embodiments of the present disclosure. In step S301, the second controller 121 of the second fan 120 receives the first rotating speed signal Vd1 from the first sensor 113. In step S302, the second controller 121 determines whether the frequency (or period length) of the first rotating speed signal Vd1 is stable. The second controller 121 can detect the period length of the first rotating speed signal Vd1 in multiple periods to determine whether the signal is stable.

In step S303, if the frequency (or period length) of the first rotating speed signal Vd1 is unstable, the second controller 121 further compares the first frequency of the first rotating speed signal Vd1 with the second frequency of the second rotating speed signal Vd2 to obtain the detection frequency difference. In step S304, the second controller 121 adjusts the duty cycle of the second driving signal according to the detection frequency difference. For example, if the detection frequency difference represents "the first frequency is greater than the second frequency 200 Hz", the second controller 121 will increase the duty cycle of the second driving signal, so that the second frequency will increase accordingly.

In step S305, if the frequency (or period length) of the first rotating speed signal Vd1 maintains stable, the second controller 121 compares the difference between the first phase and the second phase to obtain the detection phase difference. In step S306, the second controller 121 further determines whether the detection phase difference and the preset phase difference are within a set range (e.g., 90 degrees).

In step S307, if the detection phase difference and the preset phase difference are not within the set range, then during the first period, the second controller 121 will increase or decrease the duty cycle of the second driving signal from the first ratio to the second ratio according to the detection phase difference. Then, when entering the second period, the second control 121 restores the duty cycle of the second driving signal to the first ratio.

In step S308, if the detection phase difference and the preset phase difference are within the set range, during the adjustment time T1 of the first period, the second control 121 increases or decreases the duty cycle of the second driving signal from the first ratio to the second ratio according to the detection phase difference. Then, the second control 121 restores the duty cycle of the second driving signal to the first ratio during the recovery time T2 of the first period.

The above steps S301-S308 can be executed repeatedly or cyclically. In other words, during the operation of the fan system 100, the second controller 121 may repeatedly perform the judgment operation of steps S302 and S306 according to the current rotating speed of the first fan 110 and the second fan 120, so as to make corresponding adjustments.

Accordingly, through the above fan driving method, the second driving signal can be adjusted according to different situations, so that the rotating speed of the second fan 120 can be kept consistent with the first fan 110. In addition, the phase of the second fan 120 and the first fan 110 are kept at the preset phase difference to avoid overlapping of the phases of the current signals of multiple fans, so as to avoid the unstable current.

Figure 4A:
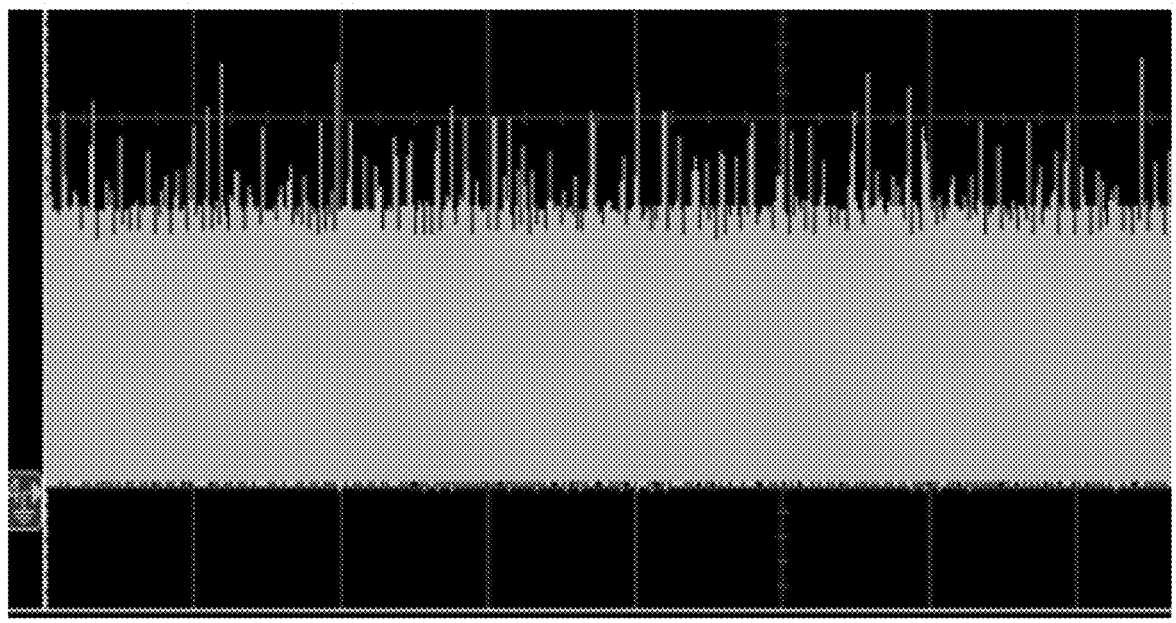
FIG. 4A is a waveform of the current signal in some embodiments of the present disclosure.
Figure 4B:
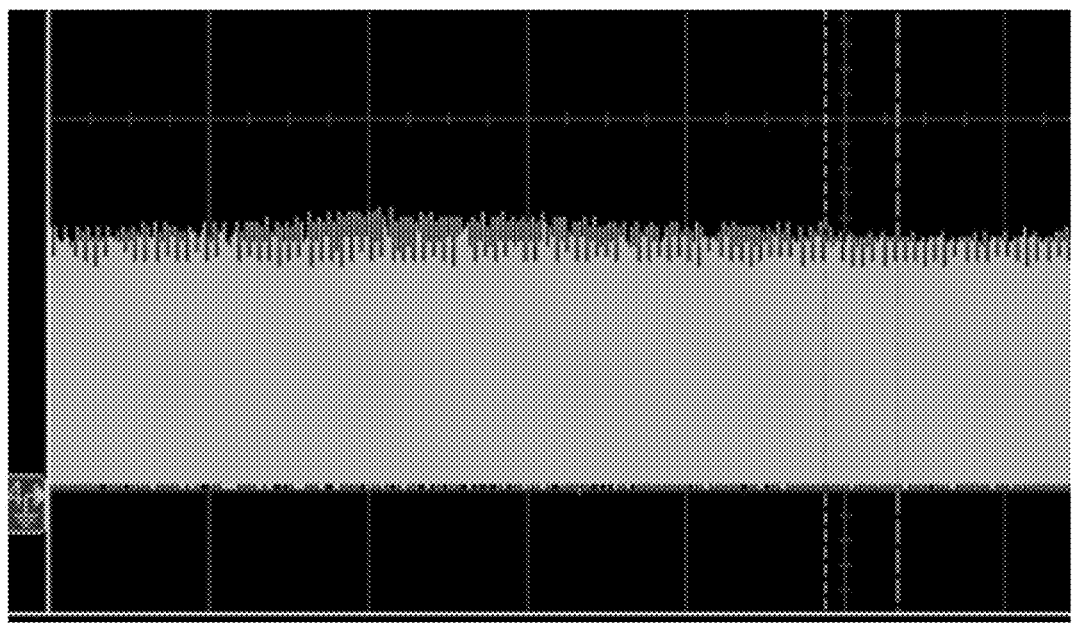
FIG. 4B is a waveform of the current signal in some embodiments of the present disclosure.

FIG. 4A is a waveforms of the power supply VDD when the fan system 100 has not adjusted the rotating speed according to the above driving method. FIG. 4B is a waveforms of the power supply VDD when the fan system 100 adjusts the rotating speed according to the above driving method. Comparing the two current waveforms, it shows that when the phase of the two rotating speed signals is staggered, the current will be more stable.

The elements, method steps, or technical features in the foregoing embodiments may be combined with each other, and are not limited to the order of the specification description or the order of the drawings in the present disclosure.

It will be apparent to those skilled in the art that various modifications and variations can be made to the structure of the present disclosure without departing from the scope or spirit of the present disclosure. In view of the foregoing, it is intended that the present disclosure cover modifications and variations of this present disclosure provided they fall within the scope of the following claims.

What is claimed is:

1. A fan driving method, comprising:
   driving a first fan according to a first driving signal, and driving a second fan according to a second driving signal;
   obtaining a first rotating speed signal from the first fan, and obtaining a second rotating speed signal from the second fan, wherein the first rotating speed signal has a first phase, and the second rotating speed signal has a second phase;
   comparing a difference between the second phase and the first phase to obtain a detection phase difference when determining that the first phase is unstable; and
   selectively increasing or decreasing a duty cycle of the second driving signal according to the detection phase difference to adjust the second phase to maintain a preset phase difference with the first phase,
   wherein the first rotating speed signal has a first frequency, the second rotating speed signal has a second frequency, and the fan driving method further comprises:
   determining whether the first frequency maintains stable;
   comparing a difference between the second frequency and the first frequency to obtain a detection frequency difference when determining that the first frequency is unstable; and
   increasing or decreasing the duty cycle of the second driving signal selectively to change the second frequency toward the first frequency according to the detection frequency difference.

2. The fan driving method of claim 1, wherein selectively increasing or decreasing the duty cycle of the second driving signal further comprises:
   increasing or decreasing the duty cycle of the second driving signal from a first ratio to a second ratio in a first period according to the detection phase difference; and
   restoring the duty cycle of the second driving signal to the first ratio in a second period.

3. The fan driving method of claim 1, wherein selectively increasing or decreasing the duty cycle of the second driving signal further comprises:
   increasing or decreasing the duty cycle of the second driving signal from a first ratio to a second ratio according to the detection phase difference in an adjustment time of a first period; and
   restoring the duty cycle of the second driving signal to the first ratio in a recovery time of the first period.

4. The fan driving method of claim 3, wherein in the recovery time, the duty cycle of the second driving signal is restored to the first ratio.

5. The fan driving method of claim 3, further comprising:
   determining whether a difference between the detection phase difference and the preset phase difference is less than 5%.

6. The fan driving method of claim 1, wherein the second fan is configured to receive the first rotating speed signal from the first fan, and is configured to determine whether the first frequency maintains stable.

7. The fan driving method of claim 1, further comprising:
   recording a plurality of signal phases of the first rotating speed signal at a plurality of starting time points of a plurality of periods of the second rotating speed signal; and comparing the plurality of signal phases of the first rotating speed signal.

8. A fan system, comprising:
a first fan configured to operate according to a first driving signal to generate a first rotating speed signal, wherein the first rotating speed signal has a first phase; and
a second fan electrically coupled to the first fan, and configured to operate according to a second driving signal to generate a second rotating speed signal, wherein the second rotating speed signal has a second phase, the second fan is configured to receive the first rotating speed signal, so as to obtain a detection phase difference between the first phase and the second phase; the second fan is further configured to selectively increase or decrease a duty cycle of the second driving signal according to the detection phase difference, and the second phase is adjusted to maintain a preset phase difference with the first phase,
wherein the first rotating speed signal has a first frequency, the second rotating speed signal has a second frequency, when the first rotating speed signal is unstable, the second fan is configured to compare a difference between a second frequency of the second rotating speed signal and the first frequency to obtain a detection frequency difference; and the second fan is further configured to selectively increase or decrease the duty cycle of the second driving signal according to the detection frequency difference, and the second frequency changes toward the first frequency.

9. The fan system of claim 8, wherein the second fan increases or decreases the duty cycle of the second driving signal from a first ratio to a second ratio according to the detection phase difference in a first period; the second fan restores the duty cycle of the second driving signal to the first ratio in a second period.

10. The fan system of claim 8, wherein the second fan increases or decreases the duty cycle of the second driving signal from a first ratio to a second ratio according to the detection phase difference in an adjustment time of a first period; the second fan restores the duty cycle of the second driving signal to the first ratio in a recovery time of the first period.

11. The fan system of claim 10, wherein the second fan restores the duty cycle of the second driving signal to the first ratio in the recovery time.

12. The fan system of claim 10, wherein the second fan is further configured to determine whether a difference between the detection phase difference and the preset phase difference is less than 5%.

13. The fan system of claim 8, wherein the second fan is configured to record a plurality of signal phases of the first rotating speed signal, and is configured to compare the plurality of signal phases of the first rotating speed signal at a plurality of starting time points of a plurality of periods of the second rotating speed signal.

\* \* \* \* \*